United States Patent [19]
Landers et al.

[11] Patent Number: 5,428,304
[45] Date of Patent: Jun. 27, 1995

[54] PROGRAMMABLE GATE ARRAY WITH SPECIAL INTERCONNECTS FOR ADJACENT GATES AND ISOLATION DEVICES USED DURING PROGRAMMING

[75] Inventors: Robert J. Landers, Plano; Mark G. Harward; Jeffrey A. Niehaus, both of Dallas; Daniel D. Edmonson, Carrollton, all of Tex.

[73] Assignee: Texas Instruments Incorporated, Dallas, Tex.

[21] Appl. No.: 272,730

[22] Filed: Jul. 8, 1994

Related U.S. Application Data

[63] Continuation of Ser. No. 936,822, Aug. 28, 1992, abandoned.

[51] Int. Cl.$^6$ .............................. H03K 19/177
[52] U.S. Cl. .............................. 326/41; 326/82; 327/525
[58] Field of Search ............ 307/465, 465.1, 202; 326/41, 82; 327/525

[56] References Cited

U.S. PATENT DOCUMENTS

| | | | |
|---|---|---|---|
| 4,642,487 | 2/1987 | Carter | 307/465 |
| 4,706,216 | 11/1987 | Carter | 307/465 |
| 4,758,745 | 7/1988 | Elgamal et al. | 307/465 |
| 4,829,203 | 5/1989 | Ashmore, Jr. | 307/465 |
| 5,144,166 | 9/1992 | Camarota et al. | 307/465.1 |
| 5,210,448 | 5/1993 | Takata | 307/465 |
| 5,243,238 | 9/1993 | Kean | 307/465.1 |
| 5,323,069 | 6/1994 | Smith, Jr. | 307/465 |

OTHER PUBLICATIONS

Mano, M. Morris; Computer Engineering: Hardware Design; ©1988 by Prentice-Hall, Inc.; p. 104.

*Primary Examiner*—David R. Hudspeth
*Assistant Examiner*—Benjamin D. Driscoll
*Attorney, Agent, or Firm*—Douglas A. Sorensen; Richard L. Donaldson; William E. Hiller

[57] ABSTRACT

Programmable circuitry (10) is provided including a plurality of logic modules (12) each having at least one input conductor (16). A nearest neighbor conductor (36) is fusibly coupled to output circuitry (25) of a selected logic module (12), the nearest neighbor conductor (36) intersecting the input conductor (16) of a nearest neighbor logic module (12). A fuse (40) disposed at the intersection of the nearest neighbor conductor (36) and the input conductor (16) of the nearest neighbor logic module (12) is provided for selectively establishing electrical coupling therebetween.

10 Claims, 3 Drawing Sheets

PROGRAMMABLE GATE ARRAY WITH SPECIAL INTERCONNECTS FOR ADJACENT GATES AND ISOLATION DEVICES USED DURING PROGRAMMING

This application is a Continuation of application Ser. No. 071936,822, filed Aug. 28, 1992, now abandoned.

TECHNICAL FIELD OF THE INVENTION

The present invention relates in general to logic circuitry and in particular to programmable logic circuitry and methods.

BACKGROUND OF THE INVENTION

A typical field programmable logic array is fabricated as an array of rows and columns of logic modules each of which is designed to perform a number of basic logic operations. Each logic module includes an output coupled to an associated output conductor and a number of inputs each coupled to an associated input conductor. The input and output conductors for the logic modules in the array are usually disposed in parallel on the face of the array in a specified direction, for example in parallel with the columns. Routing lines/tracks are then run perpendicular to the input and output conductors, typically in groups or "channels" parallel with the rows of logic modules. Fuses, which can be electrically programmed into low resistance states ("blown"), are fabricated at the intersections of the input and output conductors and the perpendicular routing lines. The output of one logic module can then be coupled to an input of another module by shorting the corresponding output conductor to a selected routing line by blowing the fuse at the output conductor/routing line intersection and then shorting the corresponding input conductor to the same routing line by blowing the fuse at the input conductor/routing line intersection.

One of the significant obstacles to building fast, low power field programmable gate arrays is the high capacitance of this interconnect scheme, especially the capacitance on the module outputs. The capacitance seen by the output of a particular logic module has two primary sources. The first source of capacitance comes from the capacitances of the "unblown" fuses located at intersections where the associated output conductor crosses a routing line to which no connection is being made (the "blown" fuses are primarily resistive and usually have a negligible capacitance in comparison). For example, if an output line runs across six channels each having 30 routing conductors and if an fuse is fabricated at each intersection, the output of the associated logic module will see the capacitance created by approximately 180 fuses, since typically the number of "blown" fuses along a given output line is small in comparison to the number of "unblown" fuses. The second substantial source of capacitance on a module output comes from unblown fuses along any routing lines coupled to the output line through a blown fuse. For example, if the associated output line is shorted by a blown fuse to a routing line having a number of unblown fuses along its length (where the routing line intersects other input and output lines) those unblown fuses will also add to the capacitance seen at the module output.

Another substantial obstacle to the fabrication of an efficient field programmable logic array comes from the isolation devices used to protect the inputs and outputs of the logic modules from the relatively high voltages applied to blow the fuses along the associated conductors during programming. These isolation devices normally are connected in series between the input or output port and the corresponding input/output conductor. The resistance of the isolation devices, in addition to the resistances of any "blown" fuses along the output conductors, increase the RC (resistance X capacitance) product, creating further signal delay.

Thus the need has arisen for improved programmable interconnection circuitry an methods which eliminate the significant disadvantages resulting from the capacitance and resistance problems inherent in presently available programmable logic arrays.

SUMMARY OF THE INVENTION

According to the invention, programmable circuitry is provided which includes a plurality of logic modules, each having at least one input conductor. A nearest neighbor conductor is fusibly coupled to the output circuitry of a selected logic module, the nearest neighbor conductor intersecting the input conductor of a nearest neighbor logic module. A fuse is disposed at the intersection of the nearest neighbor conductor and the input conductor of the nearest neighbor logic module such that an electrical coupling can be established therebetween.

The present invention eliminates the significant disadvantages resulting from the capacitance and resistance problems inherent in the presently available field programmable logic arrays. Advantageously, the present invention allows for the interconnection of nearest neighbor logic modules using short conductors with a limited number of unblown fuses along their length. Further, by avoiding the isolation transistors used in currently available programmable logic arrays, the resistive loading is also reduced, thereby minimizing propagation delay along the interconnection conductors. The reduction of capacitance and resistance on the conductors also allows for the use of smaller drivers in the logic modules themselves to drive the nearest neighbor routing resources. Additionally, the present invention provides for a reduction in chip power as a consequence of the associated reduction in capacitance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE DRAWINGS

Figure 1:
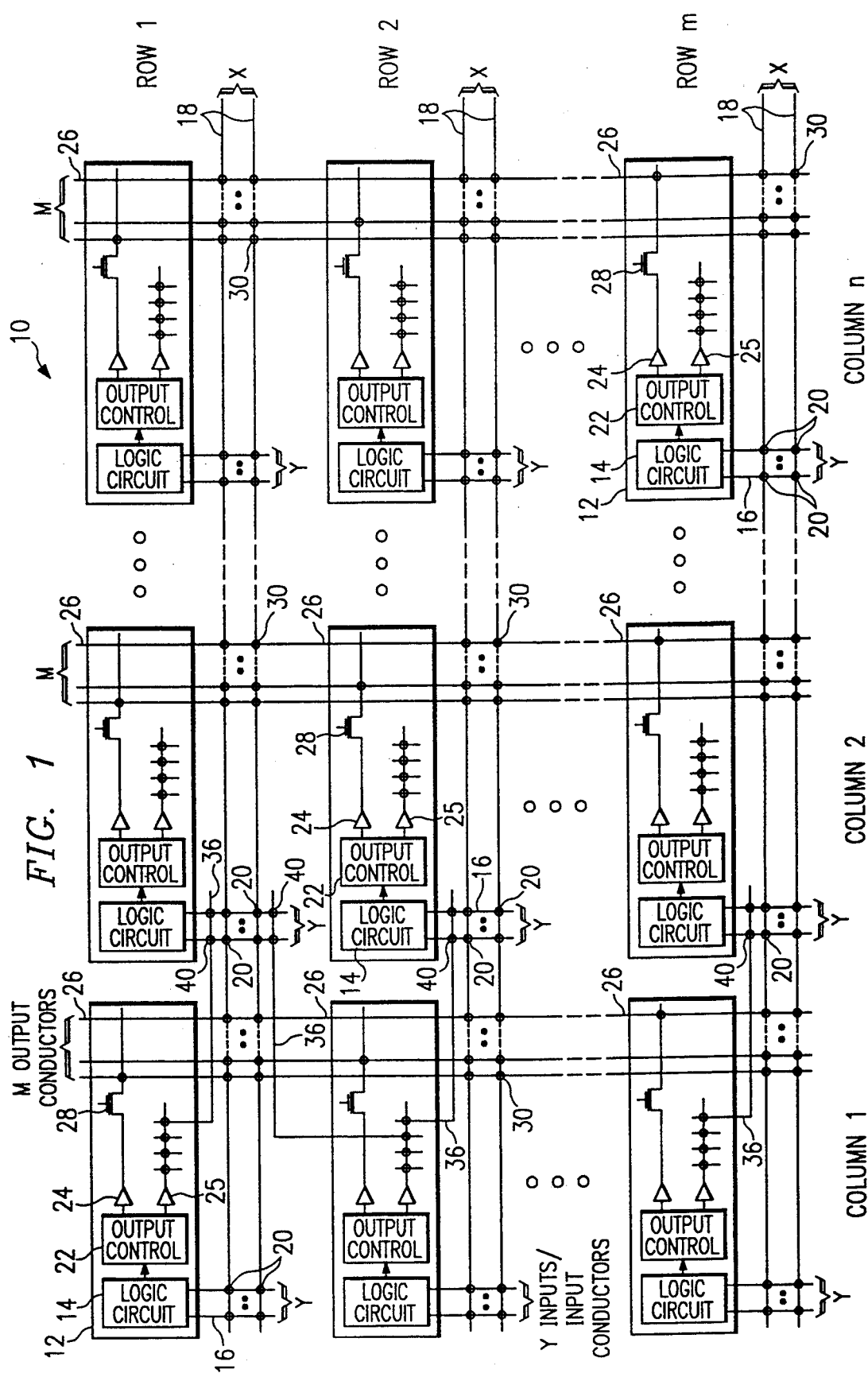
FIG. 1 is an electrical schematic diagram of a field programmable logic array according to an embodiment of the present invention.
Figure 2:
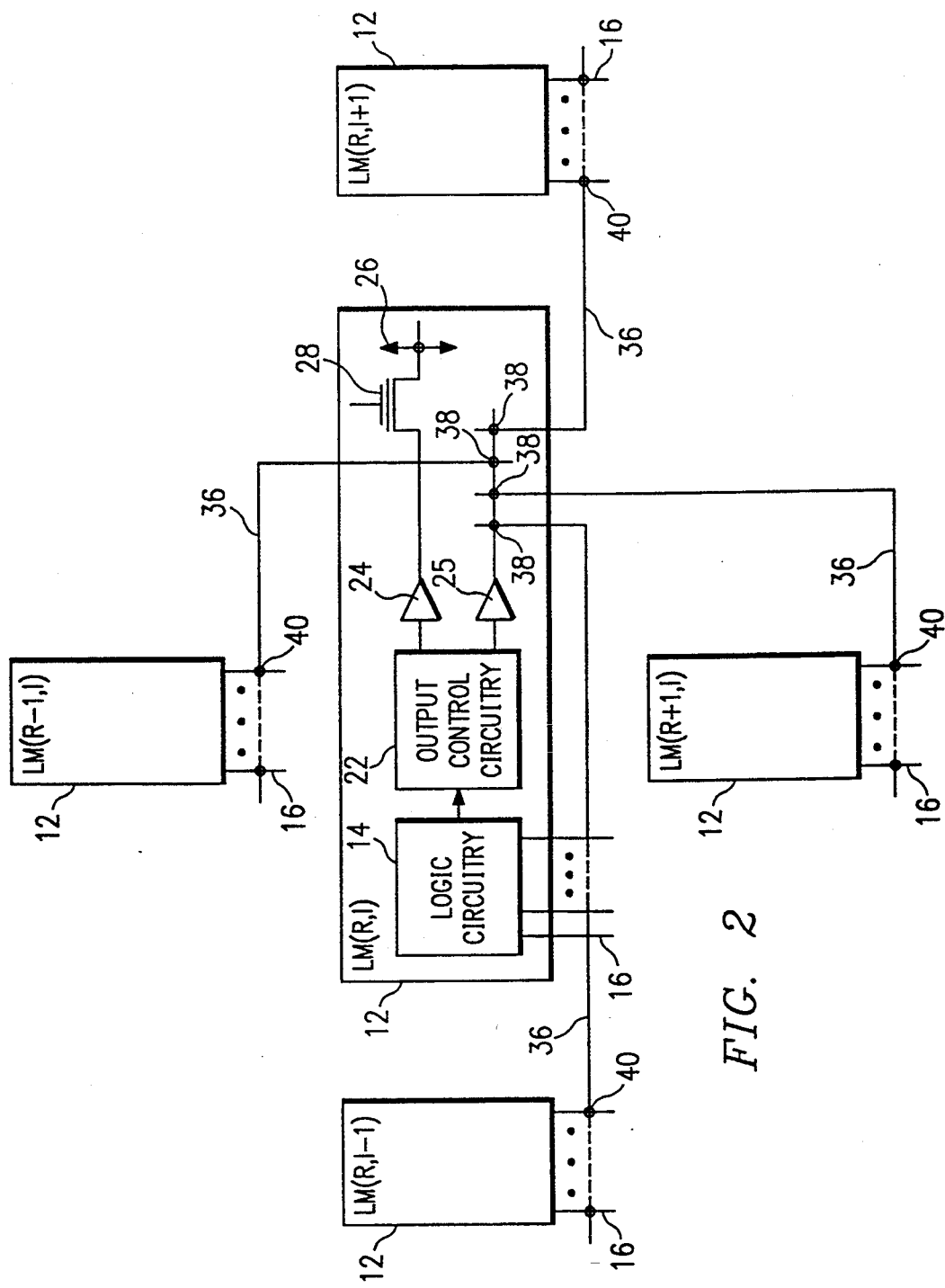
FIG. 2 is an electrical schematic diagram depicting the nearest neighbor interconnect scheme between selected modules of the array depicted in FIG. 1.
Figure 3:
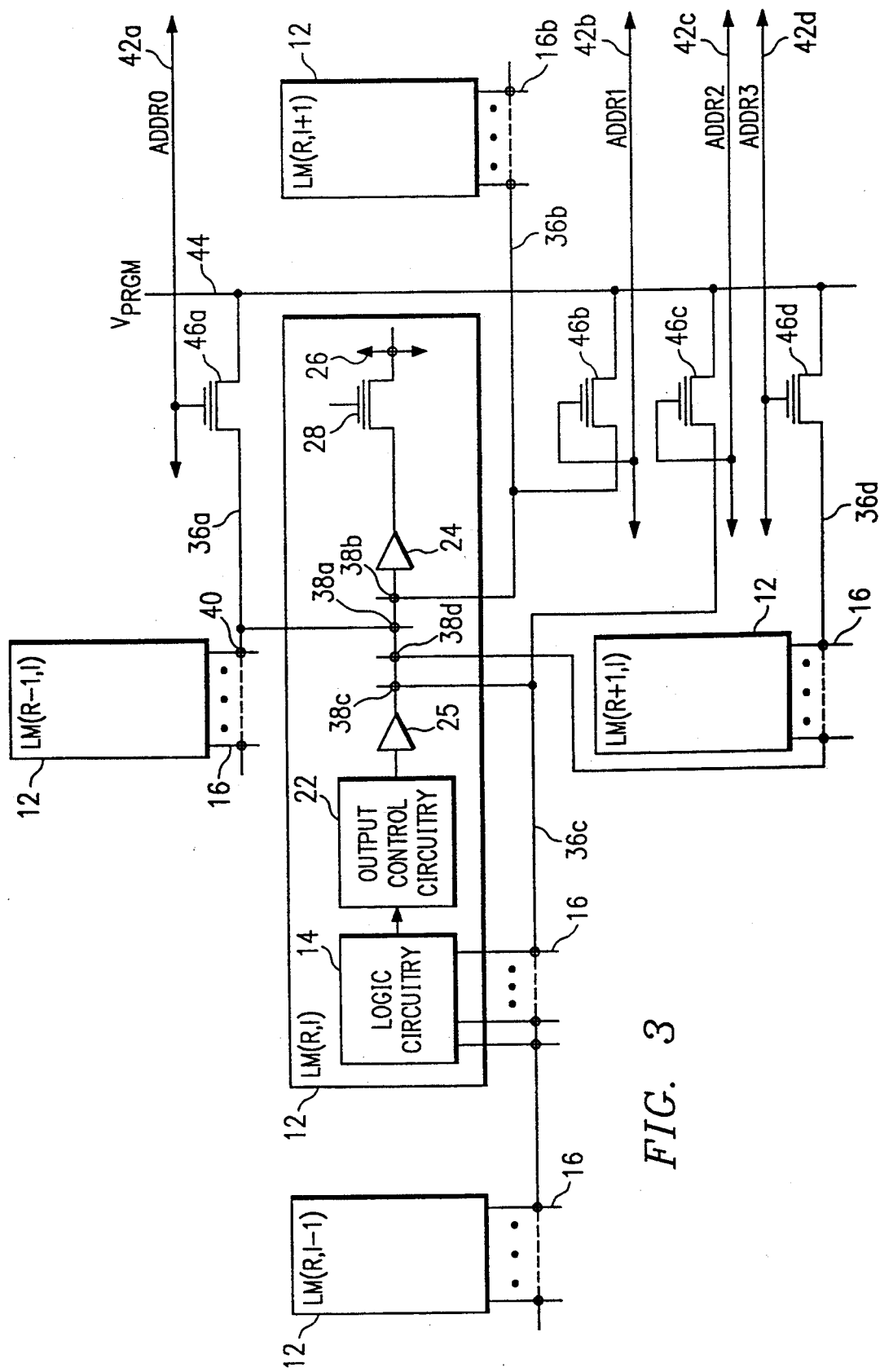
FIG. 3 is an electrical schematic diagram depicting an alternate embodiment of the nearest neighbor interconnect scheme depicted in FIG. 2.

The preferred embodiment of the present invention and its advantages are best understood by referring to FIGS. 1-3 of the drawings, like numerals being used for like and corresponding parts of the various drawings.

FIG. 1 depicts portions of a field programmable gate array 10 which includes an array of logic modules 12 arranged in m row and n columns. An enlarged depiction of a small portion of programmable gate array 10 is shown in FIG. 2. Each logic module 12 includes logic circuitry 14 which provides for the basic logic functioning of each logic module 12. The logic circuitry 14 is coupled to y input conductors 16 for the input of electrical logic signals. In a typical programmable gate array, there may be in the range of two to thirty input conductors to each logic module 12 (i.e. $y \approx 2-30$).

Running between adjacent rows of logic modules (in the "channels") are x routing conductors 18. The number of routing tracks will vary with different architectures, in a typical programmable gate array, there may be ten to fifty such routing conductors 18 between adjacent rows of logic modules 12 (i.e. $x \approx 10-50$). Where the input conductors 16 of each logic module 12 intersect the perpendicular routing conductors 18 of the adjacent channel, an fuse 20 can be fabricated. By selectively blowing fuses 20, a given input conductor 16 can be coupled to a given routing conductor 18.

Each logic module 12 further includes output control circuitry 22 coupled to the outputs of the logic circuitry 14. In the embodiment illustrated in FIGS. 1 and 2, the output control circuitry is used to select between parallel drivers 24 and 25, driver 24 having the capability of driving high capacitance loads and driver 25 being a smaller driver capable of driving lower capacitance loads. In the embodiments shown in FIGS. 1 and 2, each logic module is associated with a conventional high capacitance output conductor 26 coupled to the corresponding output driver 24 through an isolation transistor 28. Isolation transistor 28 protects the outputs of drivers 24 during the application of high voltages when fuses disposed along the output conductors 26 are being blown.

In array 10 shown in FIG. 1, the output conductors 26 run along each column of logic modules 12 such that each column of m logic modules 12 is associated with m output conductors 26. In alternative embodiments, each logic module 12 may have more than one conventional high capacitance output conductor 26 such that the number of output conductors running along each column may vary. Where each output conductor 26 intersects a routing conductor 18, an fuse 29 is disposed for programming purposes such that a selected output conductor 26 can be coupled to a selected routing-conductor 18. Thus, a pair of logic modules 12 can be interconnected by blowing a selected fuse 20 to couple the desired input conductor 16 of a first given module 12 to a selected routing conductor 18 and then blowing a selected fuse 29 to couple the output conductor 26 of a second given logic module to the same selected conductor 18. In the array shown 10 shown in FIG. 1, each output conductor 26 crosses a large number of routing conductors 18 to which no connection is made (i.e., the fuses at most of the intersections with the routing conductors 18 remain unblown). Since unblown fuses 28 disposed along each output conductor 26 are capacitive, an output conductor 26 carries a high capacitive load requiring the increased drive capability of driver 24.

According to the embodiment illustrated in FIGS. 1 and 2, each logic module 12 can also be directly connected to its "nearest neighbors" through nearest neighbor conductors 36. Nearest neighbor routing provides routing resources which allow coupling of an output of a given logic module 12 directly (or solely) to other logic modules 12 which are disposed within a predefined vicinity or distance of the given module 12. In the preferred embodiments, the "nearest neighbor" modules are disposed in relatively close proximity to each other (i.e. spaced apart by only a small distance or by a small number of modules along a given row or column in the array) and the "nearest neighbor" conductors 36 minimized in length. For clarity, in FIG. 1, only a small number of nearest neighbor interconnection conductors are shown: the conductor 36 from the output of module (1,1) to the input conductors 16 of module (1,2), the conductor 36 from the output of module (2,1) to the input conductors 16 of module (1,2), the conductor 36 from the output of module (2,1) to the input conductors 16 of module (2,2), and the conductor 36 from the output of module (m,1) to the input conductors 16 of module (m,2).

In the illustrated embodiment, as more completely depicted in FIG. 2, each logic module 24 can directly drive four of its "nearest neighbors" through the smaller driver 25 and a corresponding nearest neighbor interconnection conductors 36. The nearest neighbor conductors 36 can be selectively coupled to the output of driver 25 by blowing a corresponding fuse 38 and can be coupled to the inputs of a nearest neighbor logic module 12 through a corresponding fuse 40. A typical scheme for selectively blowing a fuse 38 to make a connection to the corresponding driver 25 will be discussed below in connection with the alternate example embodiment shown in FIG. 3. In FIG. 2, the "nearest neighbor" logic modules 12 are those logic modules immediately adjacent a selected logic module in the array 10 in both the vertical and horizontal directions. In FIG. 2, the selected logic module has been designated LM (r,1) which in the array configuration shown in FIG. 1 will be disposed in row r and column 1. In the vertical direction, the nearest neighbor would be an immediately preceding row (i.e., row $r-1$) and the next row (i.e., row $r+1$) with the column remaining the same (i.e., column 1). In the horizontal direction, the nearest neighbors are the logic modules in the same row (i.e., row R), but in the immediately preceding column (i.e., column $1-1$) and the immediately following column (i.e., column $1+1$). It is important to note that in alternate embodiments, the nearest neighbors may include additional logic modules 12 within the vicinity of a particular logic module 12. For example, those logic modules 12 two or more positions along a column or a row from a particular logic module 12 may also be considered nearest neighbors to which direct interconnection lines 36 may be run.

Advantageously, the nearest neighbor conductors 36 allow the direct connection of the logic modules 12 using relatively short conductors 36. Because the conductors 36 are short and because the number of fuses disposed along the length of a particular conductor 36 is limited to those at the intersections with the input conductors 16 of a single nearest neighbor module 12, the capacitance can be reduced. Further, by directly driving conductors 36, the resistance of isolation transistor 36 is avoided, additionally reducing the load on driver 25.

The current drive capability and size of driver circuitry 25 can correspondingly be reduced and the propagation delays along the conductors 36 also minimized.

FIG. 3 depicts an alternate embodiment of the nearest neighbor scheme shown in FIG. 2, and further depicts a scheme for providing the nearest neighbor interconnections by selectively blowing fuses 38. In the alternative embodiment shown in FIG. 3, the high capacitance drive capability is provided by the serial connection of drivers 24 and 25. The nearest neighbor interconnection conductors 36 are coupled directly to the output of driver 25, while high capacitance conductor 26 is coupled to the output of driver 24.

In the illustrated embodiment shown in FIG. 3, a nearest neighbor interconnection is made using address lines 42a–42d, programming voltage line 44 and isolation transistors 46. The interconnection of logic module LM (r,l) and logic module LM (r,l+1) will be shown for illustration purposes. In this example, an addressing voltage ADDR1 is applied to address line 42b to couple the programming voltage $V_{prgm}$ on line 44 to nearest neighbor interconnection line 36b through the corresponding isolation transistor 46b. The output control circuitry 14 of logic module LM (r,l) causes driver 25 to sink current, such that a voltage drop is created between the output of driver 25 and nearest neighbor interconnection line 36b across fuse 38b. The voltage causes fuse 38b to blow creating the required connection between the driver 25 output and nearest neighbor conductor 36b. Next, the selected input conductor 16 is pulled low such that a voltage is established across the corresponding fuse 40. The voltage across fuse 40 causes it to blow, thereby connecting the selected conductor 16b of logic module LM (r,l+1) to nearest neighbor conductor 36b. The same procedure is used to make the remaining nearest neighbor connections, when desired.

Although the present invention and its advantages have been described in detail, it should be understood that various changes, substitutions and alterations can be made herein without departing from the spirit and scope of the invention as defined by the appended claims.

What is claimed is:

1. A programmable logic array comprising:
   a plurality of output connection leads running the length of said array;
   a plurality of input connection leads running the length of said array and disposed in parallel to said output connection leads;
   a plurality of interconnection leads running the width of said array and disposed perpendicularly to said output and input connection leads;
   a first plurality of programmable links at the intersection of said output and input connection leads with said interconnection leads;
   a plurality of logic elements arranged in rows and columns, each of said logic elements including:
   a plurality of input leads,
   at least one high capacity output lead connected to a high capacity output driver, said high capacity output driver having sufficient current driving capability to drive at least one of said output connection leads or said interconnection leads; and
   at least one low capacity output lead connected to a low capacity output driver, said low capacity output driver having a current driving capability less than that of said high capacity output driver;
   a second plurality of programmable links at the intersection of said input leads of said logic elements and said input connection leads;
   a third plurality of programmable links at the intersection of said high capacity output lead of said logic elements and said output connection leads;
   at least one local interconnection lead extending from said low capacity output lead of a first logic element to the input leads of a second of said logic elements; and
   a fourth plurality of programmable links at the intersection of said local interconnection lead and said low capacity output lead and said input leads of said second logic element.

2. A programmable logic array as in claim 1 wherein said logic elements comprise programmable logic elements.

3. A programmable logic array as in claim 1 wherein said programmable links are fusible links.

4. A programmable logic array as in claim 1 wherein said second logic element is adjacent to said first logic element.

5. A programmable logic array as in claim 1 wherein said second logic element is within a selected number of logic elements away from said first logic element.

6. A programmable logic array comprising:
   a plurality of output connection leads running the length of said array;
   a plurality of input connection leads running the length of said array and disposed in parallel to said output connection leads;
   a plurality of interconnection leads running the width of said array and disposed perpendicularly to said output and input connection leads;
   a first plurality of programmable links at the intersection of said output and input connection leads with said interconnection leads;
   a plurality of logic elements arranged in rows and columns, each of said logic elements including:
   a plurality of input leads,
   at least one high capacity output lead connected to a high capacity output driver, said high capacity output driver having sufficient current driving capability to drive at least one of said output connection leads or said interconnection leads; and
   at least one low capacity output lead connected to a low capacity output driver, said low capacity output driver having a current driving capability less than that of said high capacity output driver;
   a second plurality of programmable links at the intersection of said input leads of said logic elements and said input connection leads;
   a third plurality of programmable links at the intersection of said high capacity output lead of said logic elements and said output connection leads;
   at least one local interconnection lead extending from said low capacity output lead of a first logic element to the input leads of a second of said logic elements, said interconnection lead being connected to an addressable source of programming voltage;
   a fourth plurality of programmable links at the intersection of said local interconnection lead and said low capacity output lead and said input leads of said second logic element; and
   a plurality of addressing signals provided to said addressable source of programming voltage, said low capacity output lead and a selected input lead of said second logic element, said addressing signals causing said programming voltage to be applied to said interconnection lead and causing said low capacity output lead and said selected input lead of said second logic element to be connected to a reference potential thus causing the programmable links of said fourth plurality of programmable links between said local interconnection lead, said low capacity output lead and said selected input lead of said second logic element to become conductive.

7. A programmable logic array as in claim 6 wherein said logic elements comprise programmable logic elements.

8. A programmable logic array as in claim 6 wherein said programmable links are fusible links.

9. A programmable logic array as in claim 6 wherein said second logic element is adjacent to said first logic element.

10. A programmable logic array as in claim 6 wherein said second logic element is within a selected number of logic elements away from said first logic element.

* * * * *